(12) United States Patent
Liang

(10) Patent No.: US 9,007,751 B2
(45) Date of Patent: Apr. 14, 2015

(54) FLIP-TYPE ELECTRONIC DEVICE

(71) Applicant: Dexin Corporation, New Taipei (TW)

(72) Inventor: Yueh-Chung Liang, New Taipei (TW)

(73) Assignee: Dexin Corporation, New Taipei (TW)

( * ) Notice: Subject to any disclaimer, the term of this patent is extended or adjusted under 35 U.S.C. 154(b) by 301 days.

(21) Appl. No.: 13/724,782

(22) Filed: Dec. 21, 2012

(65) Prior Publication Data

US 2014/0055920 A1    Feb. 27, 2014

(30) Foreign Application Priority Data

Aug. 23, 2012  (TW) .............................. 101216278 U

(51) Int. Cl.
   *G06F 1/16*       (2006.01)
   *H05K 5/02*       (2006.01)
   *G06F 3/02*       (2006.01)

(52) U.S. Cl.
   CPC ............ *H05K 5/0226* (2013.01); *G06F 1/1616* (2013.01); *G06F 1/1632* (2013.01); *G06F 1/1681* (2013.01); *G06F 3/0221* (2013.01)

(58) Field of Classification Search
   USPC ............. 361/679.02, 679.08, 679.21, 679.26, 361/679.27; 455/575.3; 16/223, 225, 277, 16/280, 286, 292, 297, 337, 342
   See application file for complete search history.

(56) References Cited

U.S. PATENT DOCUMENTS

| | | | | |
|---|---|---|---|---|
| 4,734,955 A * | 4/1988 | Connor | ............................ | 16/332 |
| 6,470,532 B2 * | 10/2002 | Rude | ............................... | 16/335 |
| 6,928,700 B2 * | 8/2005 | Huong | ............................. | 16/342 |
| 7,377,012 B2 * | 5/2008 | Lu | .................................... | 16/342 |
| 7,667,959 B2 * | 2/2010 | Pelkonen | .................. | 361/679.27 |
| 7,836,552 B2 * | 11/2010 | Chao | ............................... | 16/342 |
| 8,256,065 B2 * | 9/2012 | Ikunami | .......................... | 16/342 |
| 2006/0272128 A1 * | 12/2006 | Rude | ............................... | 16/342 |
| 2007/0157433 A1 * | 7/2007 | Lu et al. | .......................... | 16/342 |
| 2008/0184530 A1 * | 8/2008 | Chao | ............................... | 16/342 |
| 2010/0139042 A1 * | 6/2010 | Chang | ............................ | 16/297 |
| 2010/0263166 A1 * | 10/2010 | Wang et al. | ..................... | 16/297 |
| 2011/0314635 A1 * | 12/2011 | Chen | ................................ | 16/277 |
| 2013/0283568 A1 * | 10/2013 | Vallance et al. | ................. | 16/277 |

FOREIGN PATENT DOCUMENTS

| | | |
|---|---|---|
| TW | M247878 | 10/2004 |
| TW | M419143 | 12/2011 |

* cited by examiner

Primary Examiner — Adrian S Wilson

(74) *Attorney, Agent, or Firm* — Li & Cai Intellectual Property (USA) Office

(57) ABSTRACT

A flip-type electronic device includes a first section and a second section. The first section has a receiving portion, and an elastic plate received in the receiving portion. The elastic plate has an arched portion, and a pair of fixed portions curvedly extended from two ends of the arched portion and fixed in the receiving portion. The second section has a rotating axle fixedly exposed outside the second section and is rotatably disposed in the receiving portion. The rotating axle has a stopping protrusion protruded from a periphery thereof and an arc portion opposite the stopping protrusion. The arc portion has one end formed with a gradual portion, and the other end formed with a concave portion opposite to the gradual portion. The elastic plate is tightly against the arc portion and provides a force to make the second section fixed to the first section.

9 Claims, 15 Drawing Sheets

FLIP-TYPE ELECTRONIC DEVICE

BACKGROUND OF THE INVENTION

1. Field of the Invention

The present invention is related to a flip-type electronic device. In particular, the present disclosure relates to a flip-type (or clamshell) electronic device having a first section and a second section that fold via a hinge device pivoted to each other, which can be appeared in open condition or closed condition.

2. Description of Related Art

Because of the development of technology, there are many electronic devices are designed in flip-type (or clamshell), which means an electronics form factor being in two or more sections that are connected by hinges. For example, flip mobile phone, handheld game console, or foldable keyboard . . . etc.

The first section and the second section usually need a fixing function to fix one of the sections to the other section, such as a full open condition or a closed condition. Therefore, a pivotal structure or a hinge is required. However, the conventional hinge structure is usually too complex and the production cost is raised much, such as Taiwan R.O.C. patent number M247878 "hinge". Alternatively, a simpler hinge structure cannot provide a continuous variable operation during opening or closing, such as Taiwan R.O.C. patent number M419143 "foldable keyboard".

Therefore, it is desirable to propose a flip-type electronic device to overcome the above-mentioned problems.

SUMMARY OF THE INVENTION

The instant disclosure provides a flip-type electronic device, which provides a position-fixed function after opened, and a continuous variable operation during closing or opening; and further, makes the flip-type electronic device is fixed in a closed condition after closed.

In order to achieve the above objectives, the instant disclosure is to provide a flip-type electronic device, which includes a first section and a second section. The first section has a receiving portion, and an elastic plate received in the receiving portion. The elastic plate has an arched portion and a pair of fixed portions bended and extended from two ends of the arched portion. The pair of fixed portions is fixed in the receiving portion. The second section has a rotating axle fixedly exposed outside one side thereof. The rotating axle is rotatably disposed in the receiving portion, and has a stopping protrusion protruded from a periphery thereof and an arc portion opposite to the stopping protrusion. The arc portion has a gradual portion formed on one end thereof and a concave portion formed on the other end thereof. The gradual portion is opposite to the concave portion. A force from the elastic plate tightly against the arc portion makes the second section fixed related to the first section.

Thus, the instant disclosure has advantages as followed. The flip-type electronic device provides a position-fixed function after opened, and a continuous variable operation during closing or opening; and further, makes the flip-type electronic device is fixed in a closed condition after closed.

For further understanding of the instant disclosure, reference is made to the following detailed description illustrating the embodiments and examples of the instant disclosure. The description is for illustrative purpose only and is not intended to limit the scope of the claim.

DETAILED DESCRIPTION OF THE PREFERRED EMBODIMENTS

Figure 1:
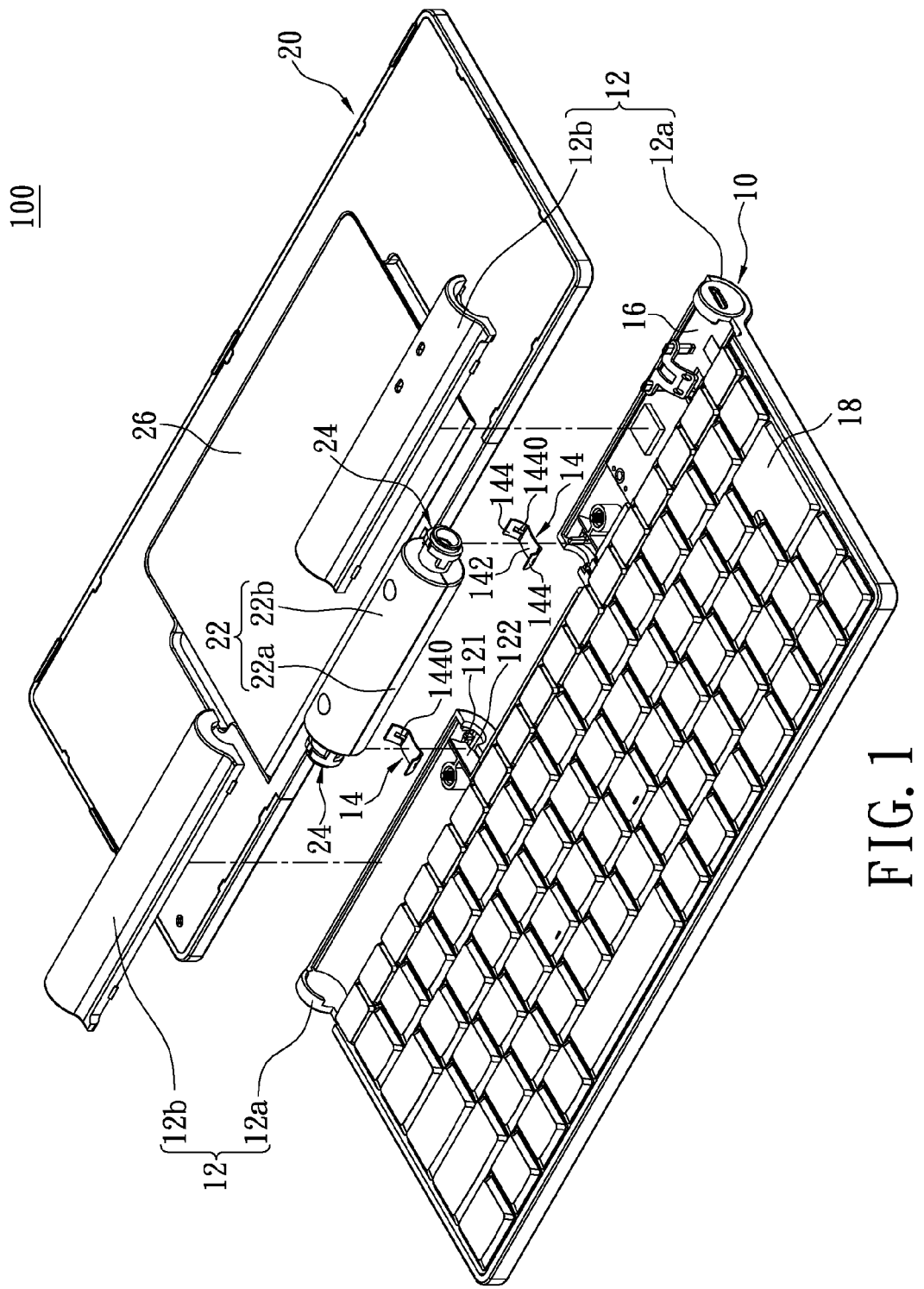
FIG. 1 is an exploded perspective view of a flip-type electronic device in an open condition according to the present disclosure.

Please refer to FIG. 1, which is an exploded perspective view of a flip-type electronic device in an open condition according to the present disclosure. The flip-type electronic device of the present invention is illustrated by flip-type keyboard, but it is not limited thereto. It can be applied on any flip-type electronic device, such as flip mobile phone, handheld game console, subnotebook computer . . . etc. The flip-type electronic device 100 includes a first section 10 and a second section 20 pivotally connected to the first section 10. In this embodiment, the first section 10 has a plurality of keycaps 18 arranged on a top surface thereof.

The first section 10 has a pair of receiving portions 12, and an elastic plate 14 received in the receiving portion 12. The elastic plate 14 has an arched portion 142 in curve-shaped and a pair of fixed portions 144 extended and bended from two ends of the arched portion 142. The pair of fixed portions 144 is fixed in the receiving portion 12. In this embodiment, the receiving portion 12 has a bottom shell 12a and an upper shell 12b. As shown in FIG. 1, the pair of receiving portions 12 is dividedly arranged at two sides of a top edge of the first section 10. The right-sided receiving portion 12 is formed with a space for receiving the elastic plate 14 and the circuit board 16. The left-sided receiving portion 12 is formed with another space. The circuit board 16 has a LED light and a USB connector exposed outside the receiving portion 12.

Figure 2:
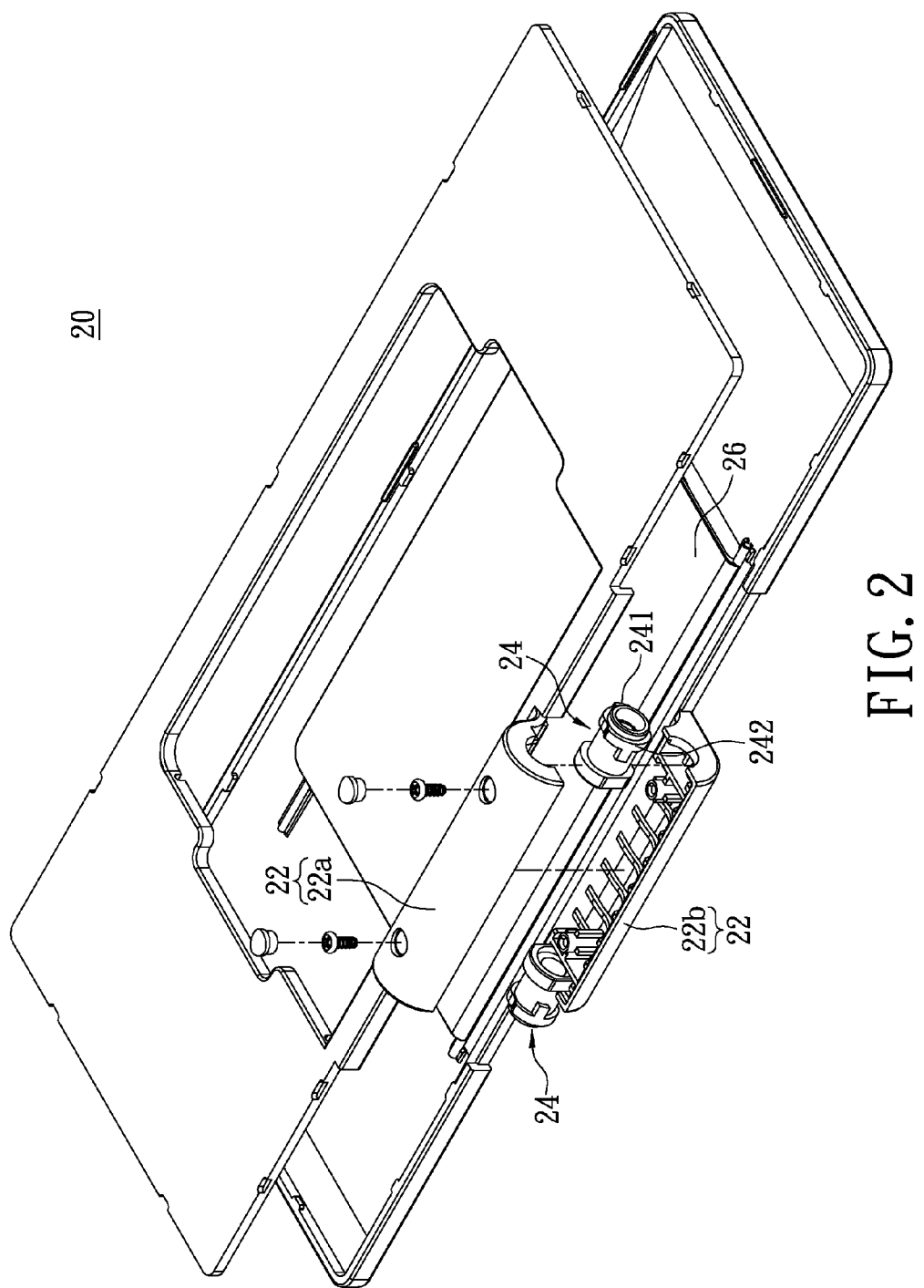
FIG. 2 is an exploded view of a second section according to the present disclosure.

The second section 20 has a pair of rotating axles 24 fixed therein and exposed outside one end thereof. The pair of rotating axles 24 is rotatably disposed in the pair of receiving portions 12 respectively. Refer to FIG. 1 and FIG. 2, the second section 20 has an axial assembly 22 located between the pair of receiving portions 12. The axial assembly 22 is composed of an upper half-housing 22a and the lower half-housing 22b. The pair of rotating axles 24 is respectively fixed at two ends of the axial assembly 22 and partially exposed outside. One supplementary point, the quantity of the rotating axle 24 and the elastic plate 14 in this embodiment can be one. The rotating axle 24 is exposed outside one side of the second section 20.

Figure 2A:
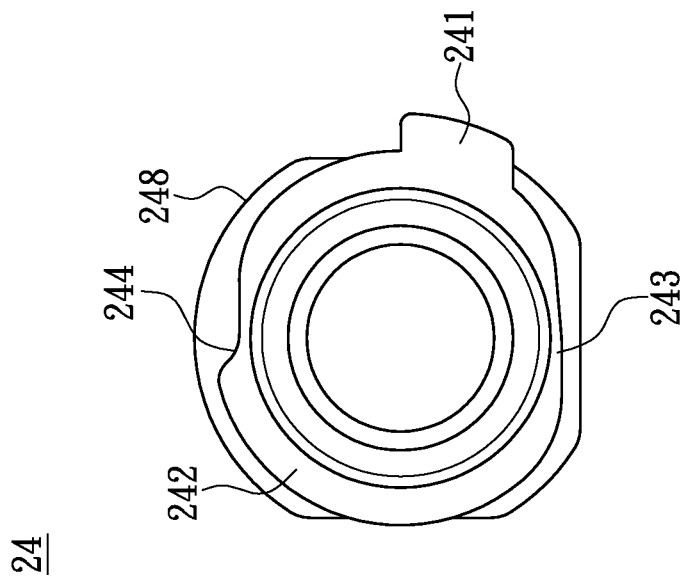
FIG. 2A is a perspective view of a hinge device according to the present disclosure.
Figure 2B:
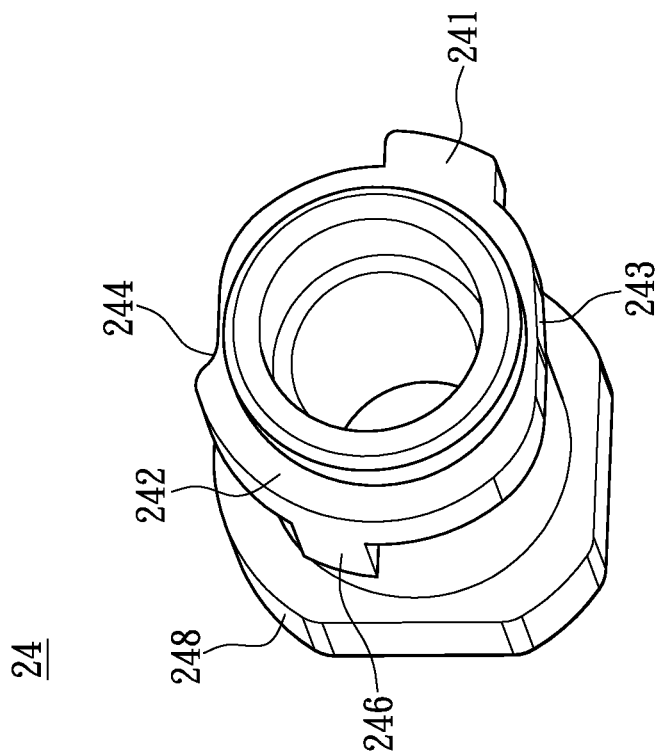
FIG. 2B is a side view of the hinge device according to the present disclosure.

Please refer to FIG. 2A and FIG. 2B, which are a perspective view and a side view of a hinge device according to the present disclosure. One end of the rotating axle 24 has a stopping protrusion 241 protruded from a periphery thereof and an arc portion 242 opposite to the stopping protrusion 241. The arc portion 242 has a gradual portion 243 formed at one end thereof, and a concave portion 244 formed at the other end thereof. The gradual portion 243 is opposite to the concave portion 244. The elastic plate 14 presses tightly against the arc portion 242 and provides a force to make the second section 20 fixed related to the first section 10. The other end of the rotating axle 24 has a mounting flange 248 formed thereon, which is clamped and fixed at two ends of the axial assembly 22 respectively. The upper half-housing 22a and the lower half-housing 22b mutually clamp and fixed the rotating axle 24. The rotating axle 24 rotates following the rotation of the second section 20.

Refer to FIG. 1. The receiving portion 12 of the first section 10 further includes a blocking wall 122. The rotating axle 24 has an outer end contacted with the blocking wall 122. The pair of fixed portions 144 of the elastic plate 14 is formed with a thin-shaped fastening slot 1440 respectively. The receiving portion 12 has at least one fixing tab 121 protruded from an inner surface thereof and extended into the fastening slots 1440 correspondingly.

Figure 3:
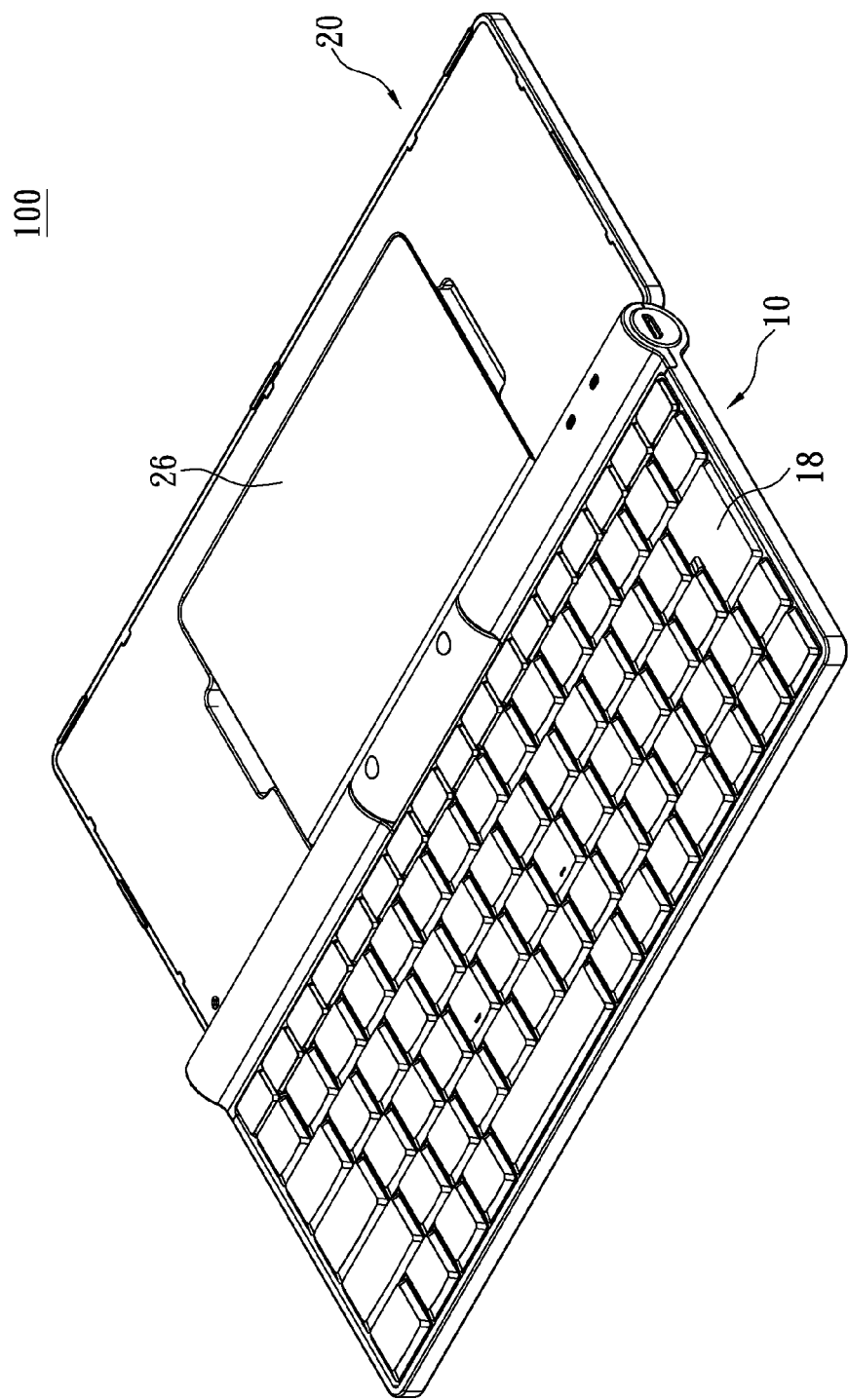
FIG. 3 is an assembled perspective view of the flip-type electronic device in open condition according to the present disclosure.
Figure 4:
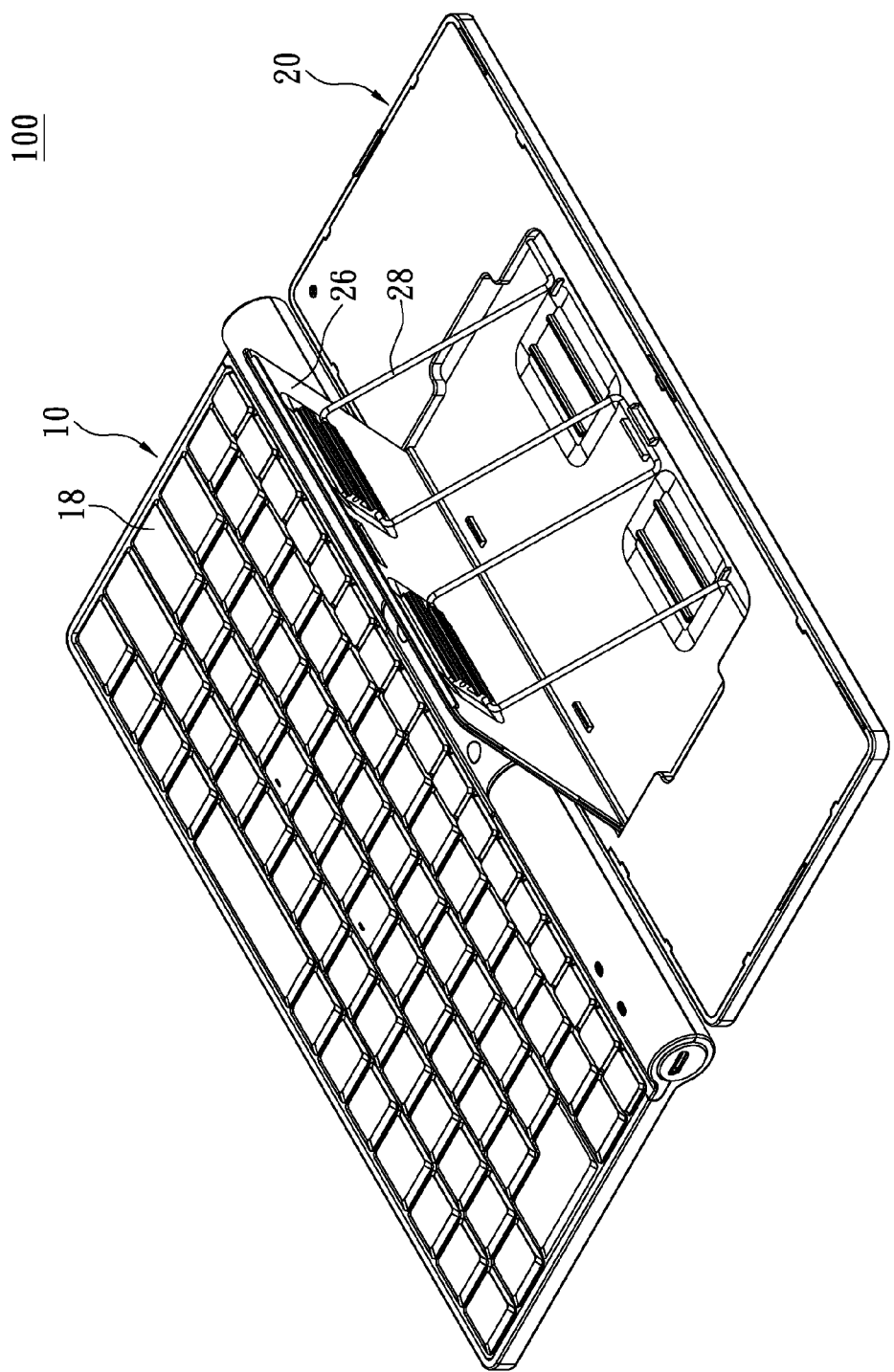
FIG. 4 is a perspective view of the flip-type electronic device with an erected supporting board according to the present disclosure.
Figure 5:
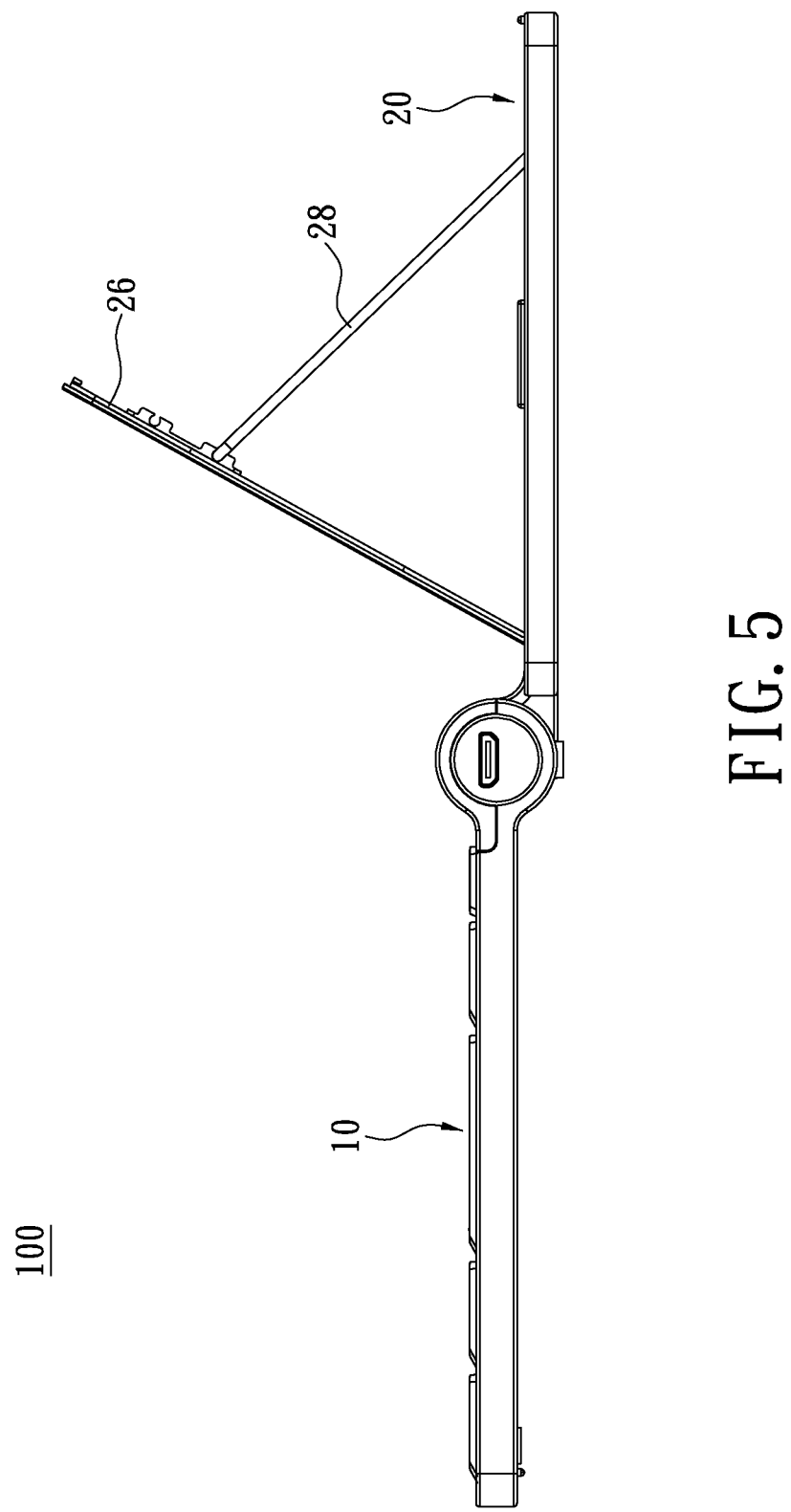
FIG. 5 is a side view of the flip-type electronic device with an erected supporting board according to the present disclosure.

Refer to FIG. 3 to FIG. 5, which shown the flip-type electronic device in a fully unfolded condition, a condition with an erected supporting board, and a side view of FIG. 4. FIG. 4 and FIG. 5 show one application of the present disclosure. The flip-type electronic device has a supporting board 26 rotatably arranged on the second section 20, and a standing rack 28 is disposed between the supporting board 26 and the second section 20. The supporting board 26 can be used to support a thin electronic device (not shown), such as a mobile phone or a tablet-type computer.

Figure 6:
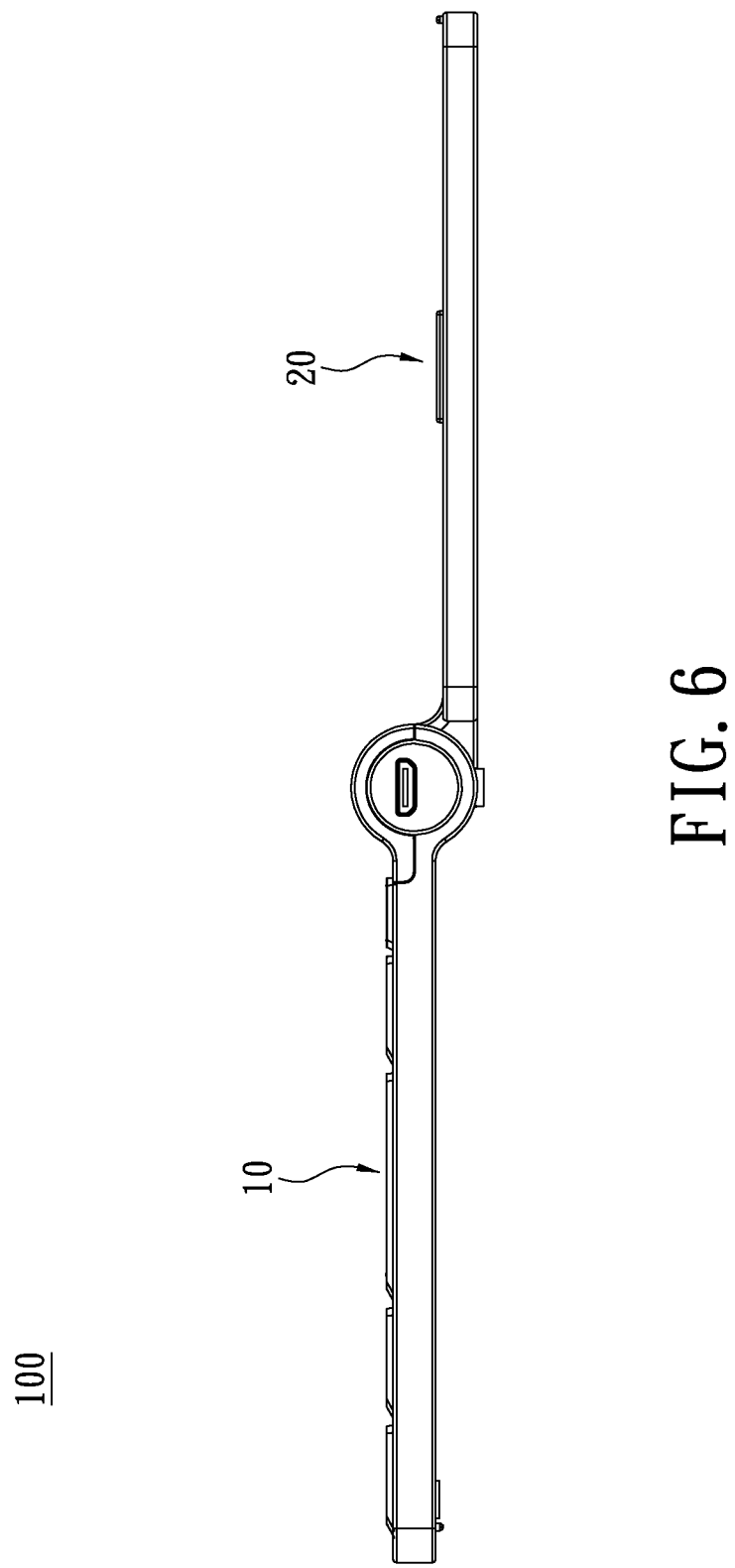
FIG. 6 is a side view of the flip-type electronic device in open condition according to the present disclosure.
Figure 6A:
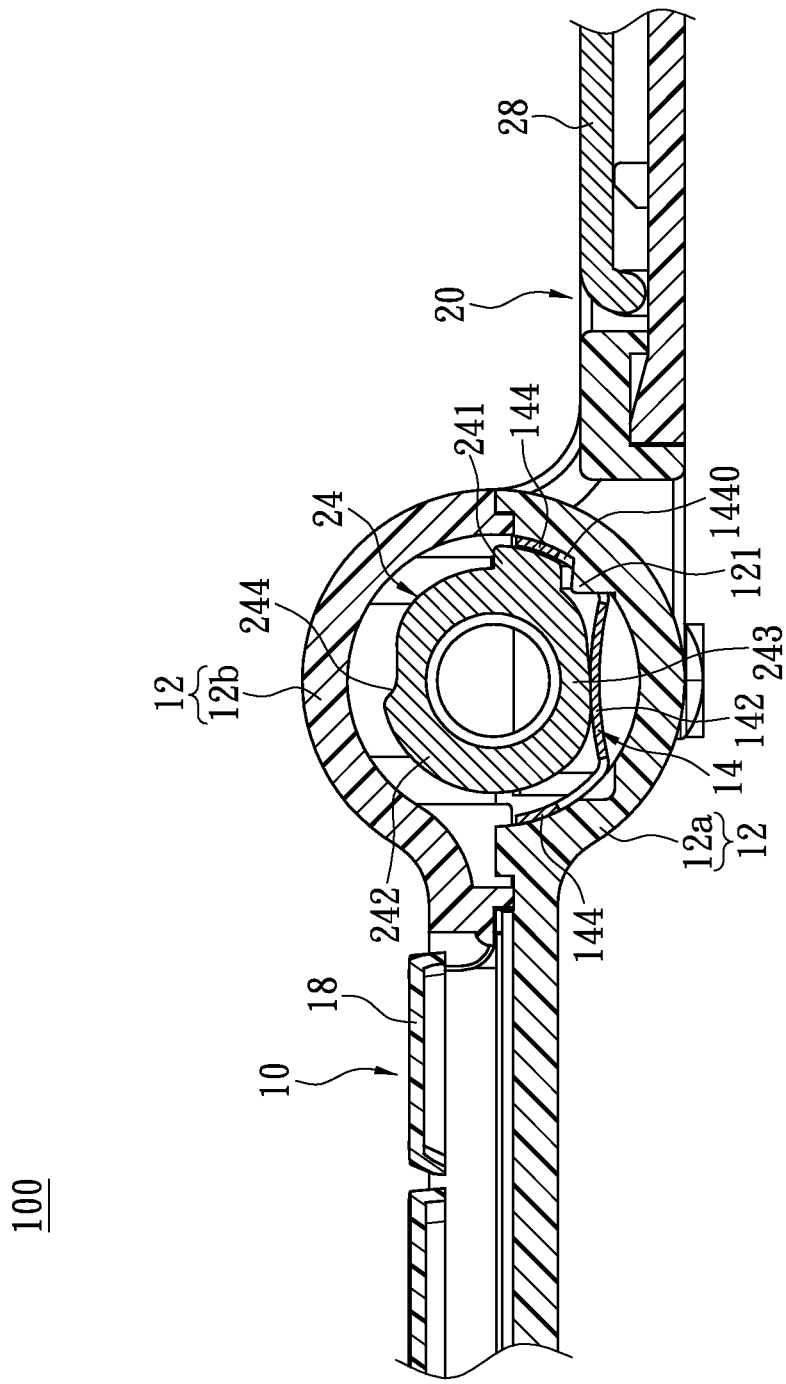
FIG. 6A is a partial enlarged view of FIG. 6.

Refer to FIG. 6 and FIG. 6A, which are a side view and a partial cross-sectional view of flip-type electronic device in fully unfolded condition. According to this embodiment, when the first section 10 is rotated related to the second section 20, the rotating axle 24 is rotated with the second section 20. When the first section 10 is rotated 180 degrees related to the second section 20 in a flat-opened condition, the gradual portion 243 of the rotating axle 24 contacts the arched portion 142 of the elastic plate 14. Besides, the stopping protrusion 241 is against the fixing tab 121. The fixing tab 121 simultaneously provides a fixing function for the elastic plate 14 and a blocking function for the rotating axle 24, so that the first section 10 is avoided from turning excessively. A protect function is provided to the flip-type electronic device 100. In the meantime, the gradual portion 243 only slightly contacts the arched portion 142, and the arched portion 142 substantially is not compressed in an original shape.

An alternative embodiment, the stopping protrusion 241 can be arranged at different peripheral places of the rotating axle 24, so that the first section 10 and the second section 20 can be positioned at different angles. It can be changed according to design requirement.

Figure 6B:
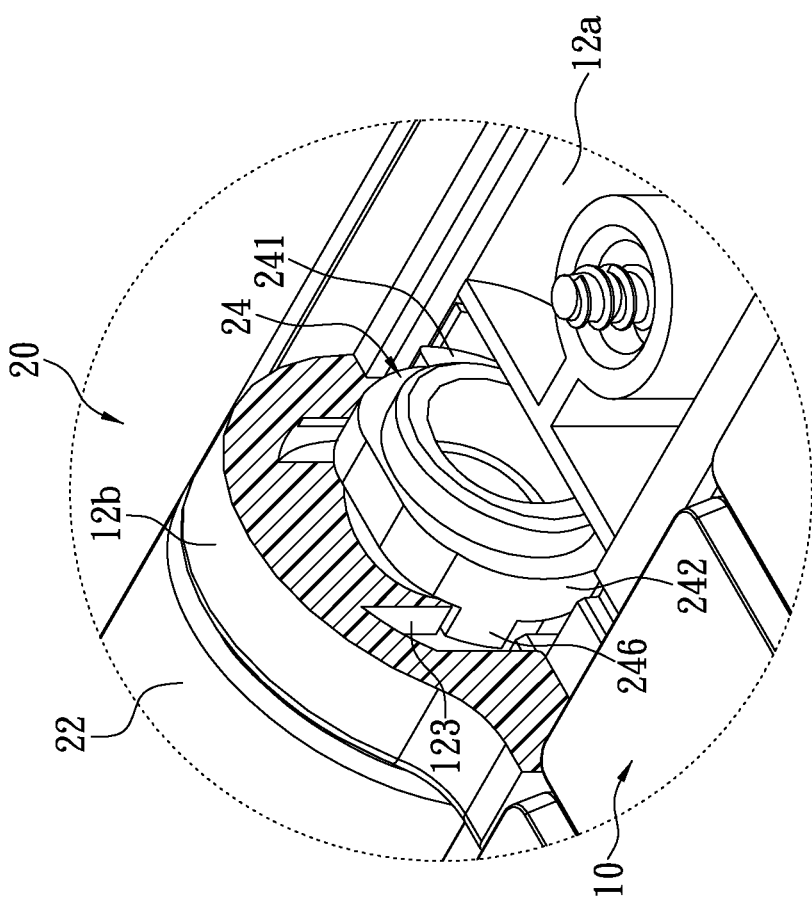
FIG. 6B is a partial enlarged perspective view of FIG. 6.

Please refer to FIG. 6B, which is a partial enlarged perspective view of the flip-type electronic device in a full-opened condition. As shown in this figure, the upper shell 12b of the receiving portion 12 is partially removed, thus the rotating axle 24 is visible. To enhance a blocking strength for the first section 10 as turning 180 degrees related to the second section 20, the arc portion 242 further has a lateral stopping portion 246 extended from a periphery of the rotating axle 24. The lateral stopping portion 246 is extended toward the mounting flange 248. An inner side of the upper shell 12b of the receiving portion 12 has an assistant block 123 extended toward the rotating axle 24. When the first section 10 and the second section 20 are arranged in flat-opened condition, the assistant block 123 blocked the lateral stopping portion 246.

Figure 7:
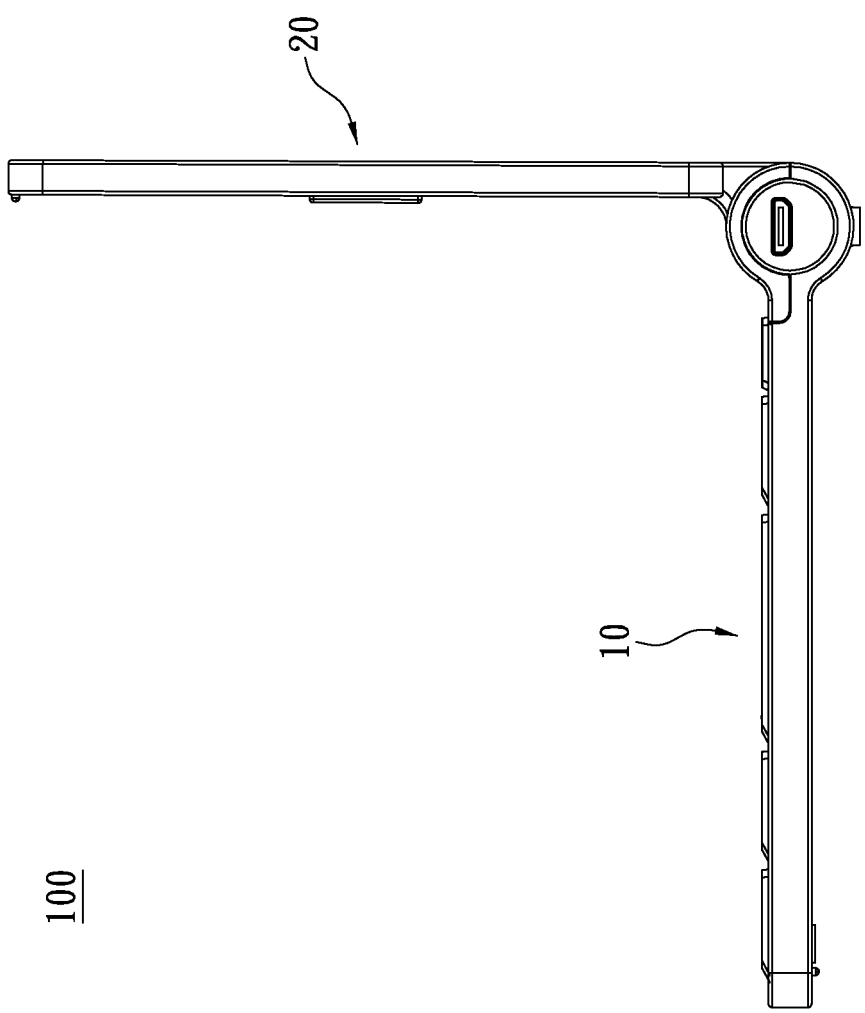
FIG. 7 is a side view of the flip-type electronic device with a first section rotated slightly according to the present disclosure.
Figure 7A:
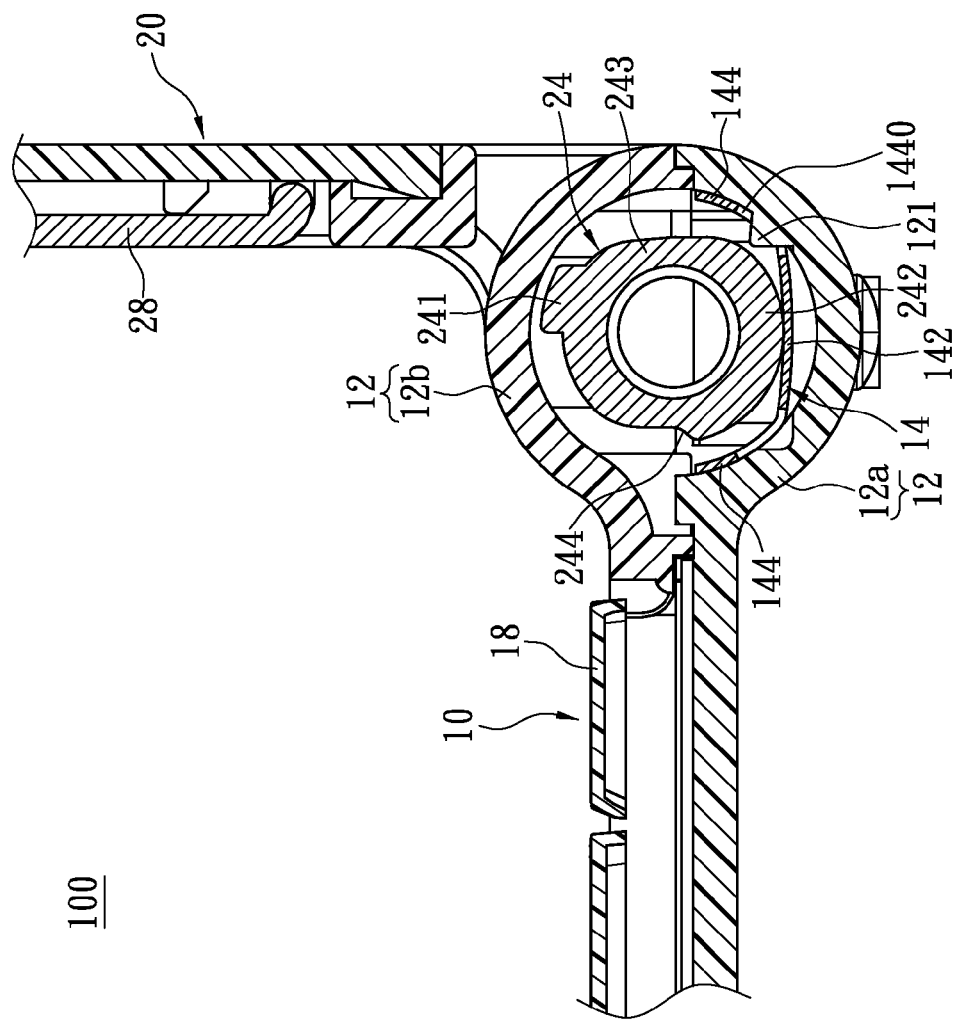
FIG. 7A is a partial cross-sectional view of the flip-type electronic device with a first section rotated slightly according to the present disclosure.

Refer to FIG. 7 and FIG. 7A, which are a side view and a cross-sectional view of the flip-type electronic device partially opened. When the first section 10 is turned partially related to the second section 20 such as during the process of closing downward, the arc portion 242 is protruded beyond the periphery of the rotating axle 24 and presses the arched portion 142 of the elastic plate 14. The arched portion 142 is deformed and provides an upward elasticity against the rotating axle 24 tightly. Therefore, the first section 10 is avoided from rotating outward because of gravity or colliding with the first section 10 directly. From another point of view, such arrangement can provide the function of continuous variable positioning when user is turning the first section 10.

Figure 8:
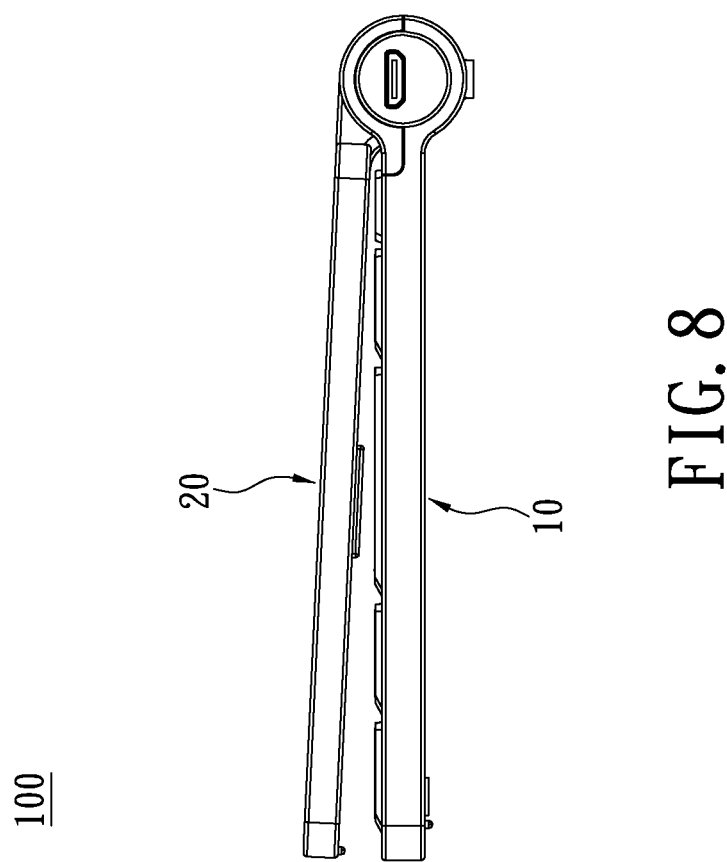
FIG. 8 is a side view of the flip-type electronic device with a slight included angle according to the present disclosure.
Figure 8A:
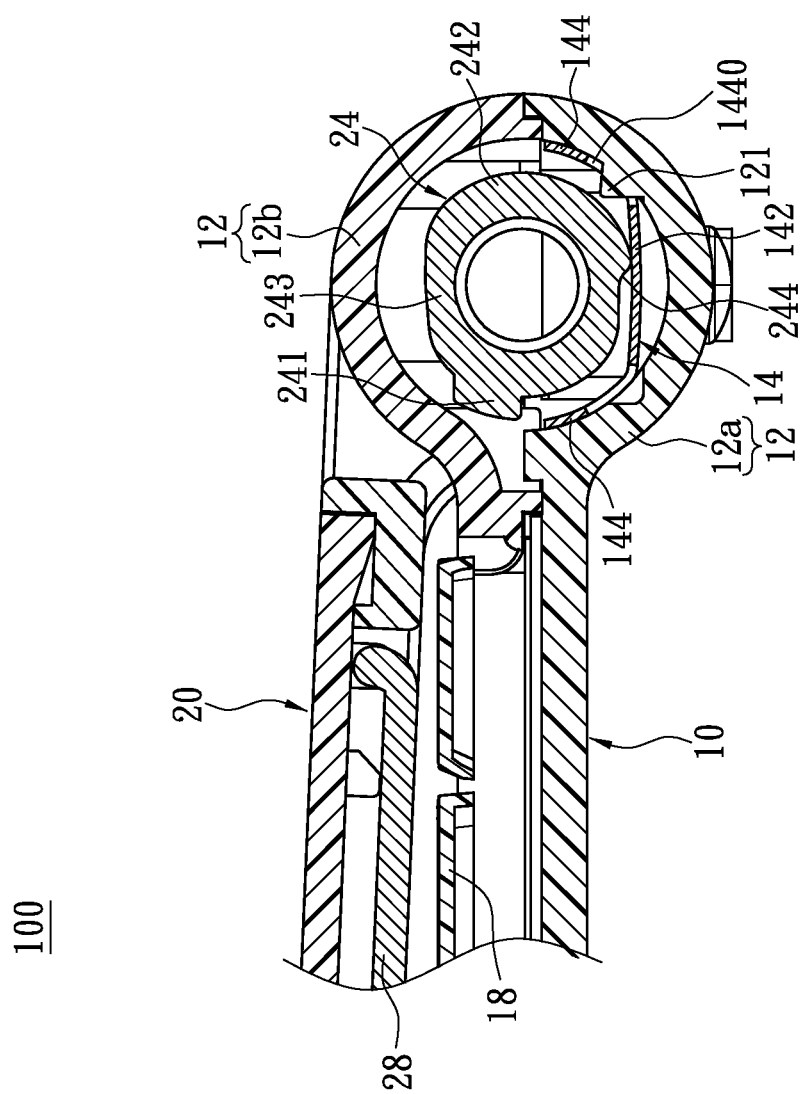
FIG. 8A is a side cross-sectional view of the flip-type electronic device with a slight included angle according to the present disclosure.

Refer to FIG. 8 and FIG. 8A, which are a side view or a cross-sectional view of the flip-type electronic device opened in a small induced angle. When user continuously closes the first section 10 to the second section 20 with an induced angle 5-10 degrees as shown in FIG. 8, the arched portion 242 of the rotating axle 24 removes counterclockwise from the elastic plate 14. In that meantime, the arched portion 142 of the elastic plate 14 provides an elasticity acted on a protrusion of the arc portion 242 closed to the concave portion 244, so that the rotating axle 24 is pushed to move counterclockwise. Therefore, this embodiment can provide the first section 10 a closing force toward the second section 20 by the elastic plate 14, when the flip-type electronic device 100 is almost closed in a small induced angle. As a result, this arrangement can help user to close the first section 10 to the second section 20.

Figure 9:
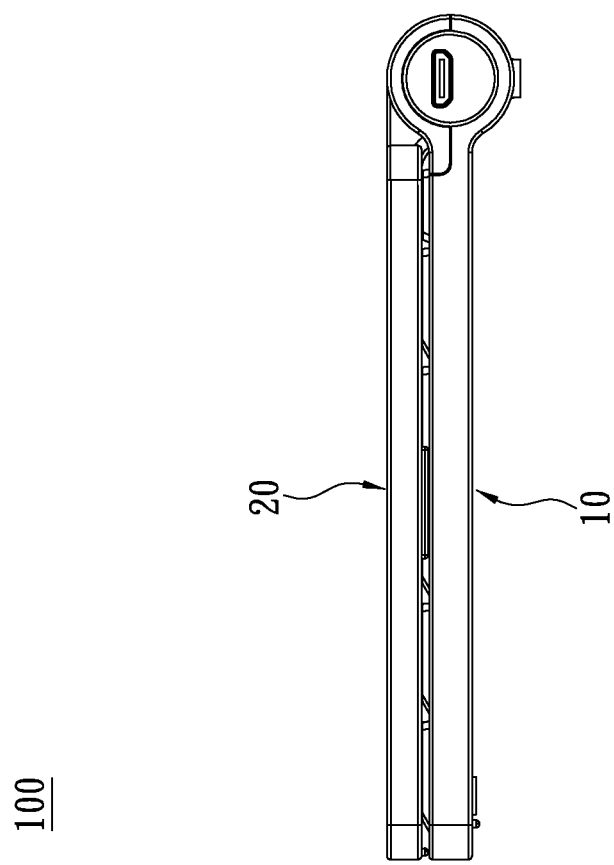
FIG. 9 is a side view of the flip-type electronic device in closed condition according to the present disclosure.
Figure 9A:
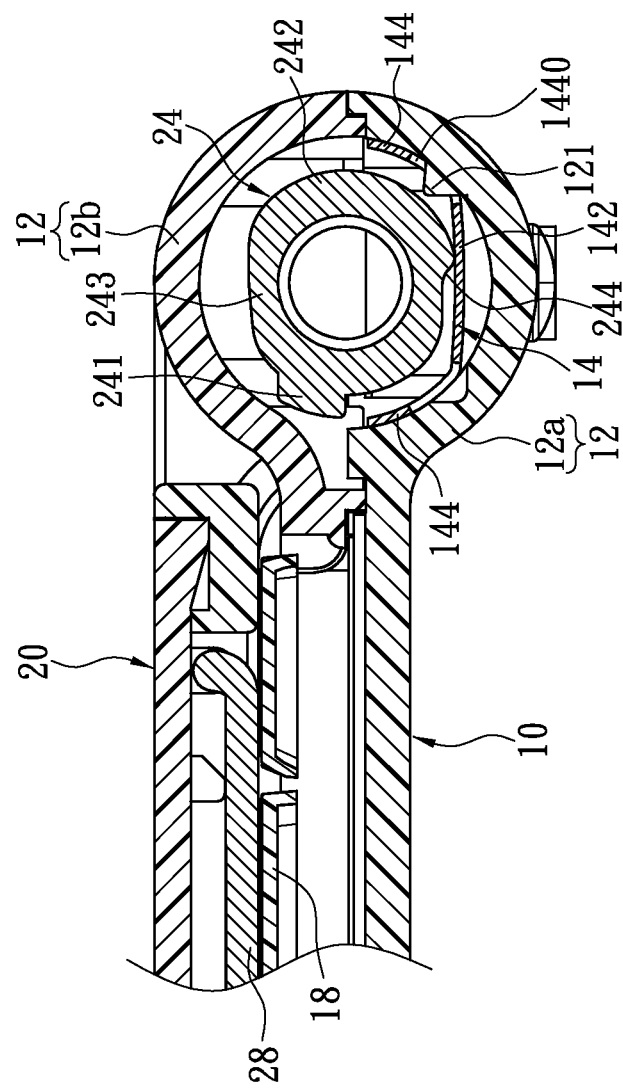
FIG. 9A is a side cross-sectional view of the flip-type electronic device in closed condition according to the present disclosure.

Refer to FIG. 9 and FIG. 9A, which are a side view and partial cross-sectional view of the flip-type electronic device in closed condition. Through the above-mentioned structure, the arched portion 142 of the elastic plate 14 provides elasticity acted on the concave portion 244, and in the meantime also provides a some degree of resistance when turning the first section 10 away from the second section 20. In other words, through the action between the rotating axle 24 and the elastic plate 14, this embodiment can make the flip-type electronic device 100 being positioned in closed condition after being closed.

In conclusion, the flip-type electronic device of this present invention utilizes a two-pieces pivotal structure of the rotating axle 24 and the elastic plate 14. Not only the structure is simplified with an easier assembly process, but also multi-functions are provided as followed.

First, the flip-type electronic device of the present invention provides a blocking function after it is opened, such as 180 degrees, with an enhanced blocking strength.

Second, the flip-type electronic device of the present invention can provide an operation feel of continuous variable positioning during closing or opening.

Third, the flip-type electronic device of the present invention can provides an assistant force for fully closing when it is almost closed, and a some degree of resistance when turning the first section 10 away from the second section 20, to make the flip-type electronic device 100 being positioned at closed condition.

Some modifications of these examples, as well as other possibilities will, on reading or having read this description, or having comprehended these examples, will occur to those skilled in the art. Such modifications and variations are comprehended within this invention as described here and claimed below. The description above illustrates only a relative few specific embodiments and examples of the invention. The invention, indeed, does include various modifications and variations made to the structures and operations described herein, which still fall within the scope of the invention as defined in the following claims.

What is claimed is:

1. A flip-type electronic device, comprising:
   a first section, having a receiving portion, and an elastic plate received in the receiving portion, the elastic plate having an arched portion and a pair of fixed portions bended and extended from two ends of the arched portion, the pair of fixed portions fixed in the receiving portion; and
   a second section, having a rotating axle fixedly exposed outside one side thereof, the rotating axle rotatably disposed in the receiving portion, a periphery of the rotating axle having a stopping protrusion protruded therefrom and an arc portion opposite to the stopping protrusion, the arc portion having a gradual portion formed on one end thereof and a concave portion formed on the other end thereof, wherein the gradual portion is opposite to the concave portion, wherein a force from the elastic plate tightly against the arc portion makes the second section fixed related to the first section.

2. The flip-type electronic device as claimed in claim 1, wherein the first section further includes a blocking wall, wherein the rotating axle has an outer end contacted the blocking wall.

3. The flip-type electronic device as claimed in claim 1, wherein pair of fixed portions of the elastic plate is formed with a fastening slot respectively, the receiving portion has a pair of fixing tabs protruded from an inner surface thereof extended into the fastening slots correspondingly.

4. The flip-type electronic device as claimed in claim 3, wherein the first section and the second section are arranged in flat-opened condition, the stopping protrusion of the rotating axle is against the fixing tab.

5. The flip-type electronic device as claimed in claim 1, wherein the rotating axle further includes a mounting flange formed on a periphery thereof, the second section clamped and fixed the mounting flange.

6. The flip-type electronic device as claimed in claim 5, wherein the arc portion further includes a lateral stopping portion extended from a periphery of the rotating axle, wherein the receiving portion has an assistant block extended from an inner side thereof toward the rotating axle; when the first section and the second section are arranged in flat-opened condition, the assistant block blocked the lateral stopping portion.

7. The flip-type electronic device as claimed in claim 6, wherein the lateral stopping portion is extended toward the mounting flange.

8. The flip-type electronic device as claimed in claim 1, further comprising a supporting board rotatably arranged on the second section, and a standing rack is disposed between the supporting board and the second section.

9. The flip-type electronic device as claimed in claim 8, wherein the first section has a plurality of keycaps arranged on a top surface thereof.

* * * * *